United States Patent [19]

Stewart et al.

[11] Patent Number: 4,464,754
[45] Date of Patent: Aug. 7, 1984

[54] MEMORY SYSTEM WITH REDUNDANCY FOR ERROR AVOIDANCE

[75] Inventors: Roger G. Stewart, Neshanic Station; Andrew G. F. Dingwall, Bridgewater, both of N.J.

[73] Assignee: RCA Corporation, New York, N.Y.

[21] Appl. No.: 362,462

[22] Filed: Mar. 26, 1982

[51] Int. Cl.³ .............................................. G06F 11/10
[52] U.S. Cl. .......................................... 371/51; 371/10
[58] Field of Search .............................. 371/51, 49, 10

[56] References Cited

U.S. PATENT DOCUMENTS

3,245,040  4/1966  Burdett et al. .......................... 371/49
4,051,355  9/1977  Lin .......................................... 371/51

Primary Examiner—Charles E. Atkinson
Attorney, Agent, or Firm—Joseph S. Tripoli; George E. Haas; Henry I. Schanzer

[57] ABSTRACT

A memory system in which two or more memory modules containing the same information have their respective data outputs connected to the same data line. Each module includes means for checking the parity of the data being read-out at its output and in the event of a parity error indication effectively disconnects its output from the data line.

4 Claims, 4 Drawing Figures

MEMORY SYSTEM WITH REDUNDANCY FOR ERROR AVOIDANCE

This invention relates to a memory system and in particular to the detection of errors and the avoidance of faulty read-outs from the memory system.

In many data handling systems several semiconductor integrated circuits (IC's) defined herein as "subsystems" are interconnected to form a memory system. Each IC, or chip, may contain anywhere from 1K to more than 64K bits of information and is gnerally referred to as a large scale integrated (LSI) circuit or a very large scale integrated (VLSI) circuit.

The advent of LSI and VLSI circuits has introduced new problems in the areas of reliability and testability at the subsystem level. Some are a consequence of reducing the size of the memory cells. The resulting smaller nodal capacitances render the memory cells more susceptible to data upset by noise and radiation effects. Also, due to the smaller memory cells and larger bit line capacitances, smaller bit line signal swings are produced increasing the possibility of errors in reading (sensing) the stored information or in writing the desired information. Consequently, the probability of errors is significantly increased due to the large (and ever increasing) number of cells in each IC (i.e. subsystem) and to the increased number of sources of error. The probablity of errors is compounded when several of these subsystems are combined to form a memory system.

The reliability of the memory system may be improved by using known error detection and correction circuitry. For example, large main frame computer systems may make use of Hamming or other high order error detecting and correcting codes to produce reliable and testable memory systems. However, the use of such codes add significantly to the circuit complexity, and limit the speed of operation of the memory systems. Also, these codes generally can only correct one error. An object of the present invention is to provide fault detection which is simple and does not limit the speed of operation of the memory system.

A memory system embodying the invention includes two or more memory modules containing the same information which have their respective data outputs connected to the same data line. Each module includes means for checking the parity of a group of bits containing a particular data bit (or bits) being read-out of the module. In the event of a parity error indication, means within each module prevent read-out of information from the module onto the data line. If the parity signal is correct the particular data bit (or bits) is read-out onto the data line.

In the accompanying drawing like reference characters denote like components.

Figure 1:
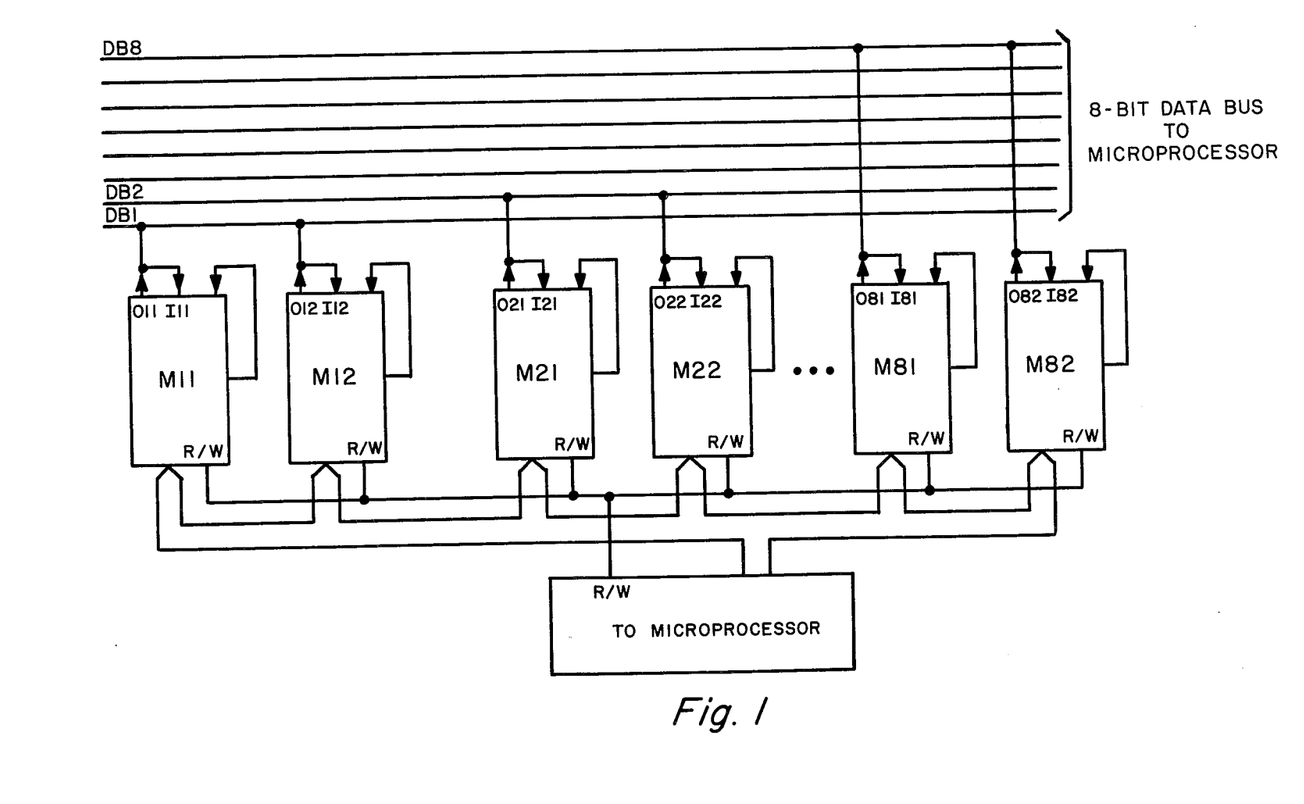
FIG. 1 is a block diagram of a memory system embodying the invention.

The memory system of FIG. 1 includes 8 sets (i=8) of two memory chips (Mij), where M identifies a memory chip, i the chip set, and j the chip within a set. Two chips (e.g. M11 and M12; - - - M81 and M82) are shown per set for ease of illustration. However, more than two chips could be used per set to increase the system reliablity and the number of errors that can be detected and corrected). The data input (Iij) of each chip is connected to its data output (Oij) and the I/Oij terminals of the chips of a set are connected to the same data bus line DBi. Information to be written into each set of chips is applied to the data bus lines by a microprocessor or other source (not shown). Consequently, the same information is written into each chip of a set and, assuming error free operation, the same information should be read-out from each chip of a set. Consequently, barring any error or defect, each chip of a set stores an identical copy of the data stored in the other chips of a set. As detailed below, each chip Mij includes means for reading-out a data bit (Dij) onto a data bit line DBi and for reading a selected internal word which includes the data bit (Dij). The chip also includes means for determining whether or not the parity of the selected internal word is correct and for producing a parity signal indicative thereof. If the parity signal indicates the presence of a parity error the data bit (Dij) of the chip (Mij) is not read-out onto the data bit line (DBi). This is accomplished by coupling the data bit (Dij) of each chip (Mij) to its corresponding data bit line (DBi) via a tri-state circuit (G6ij in FIG. 2B) which is controlled by the value of the parity signal and the data bit (Dij). If a parity error is detected, the tri-state circuit output is set to a floating condition whereby the chip output appears as a high output impedance and is effectively removed or disconnected from the circuit. Thus, whenever a chip contains an error it has little if any effect on the signal applied to its corresponding data bit line. The other chip (or chips) connected to the data bit line then determines the signal of the line. For example, assume that chips M11 and M12 are addressed whereby a selected internal word is read in each chip and concurrently, a particular data bit contained within each selected word is selected for read-out. A parity check on the selected internal word is performed within each chip. If the parity check in chip M11 indicates the presence of a parity error, the data bit (D11) from chip M11 will not be read-out onto DBi. Assuming the parity check in chip M12 indicates no parity error, the data bit (D12) from chip M12 will be read-out and applied to bit line DB1.

Figure 2A:
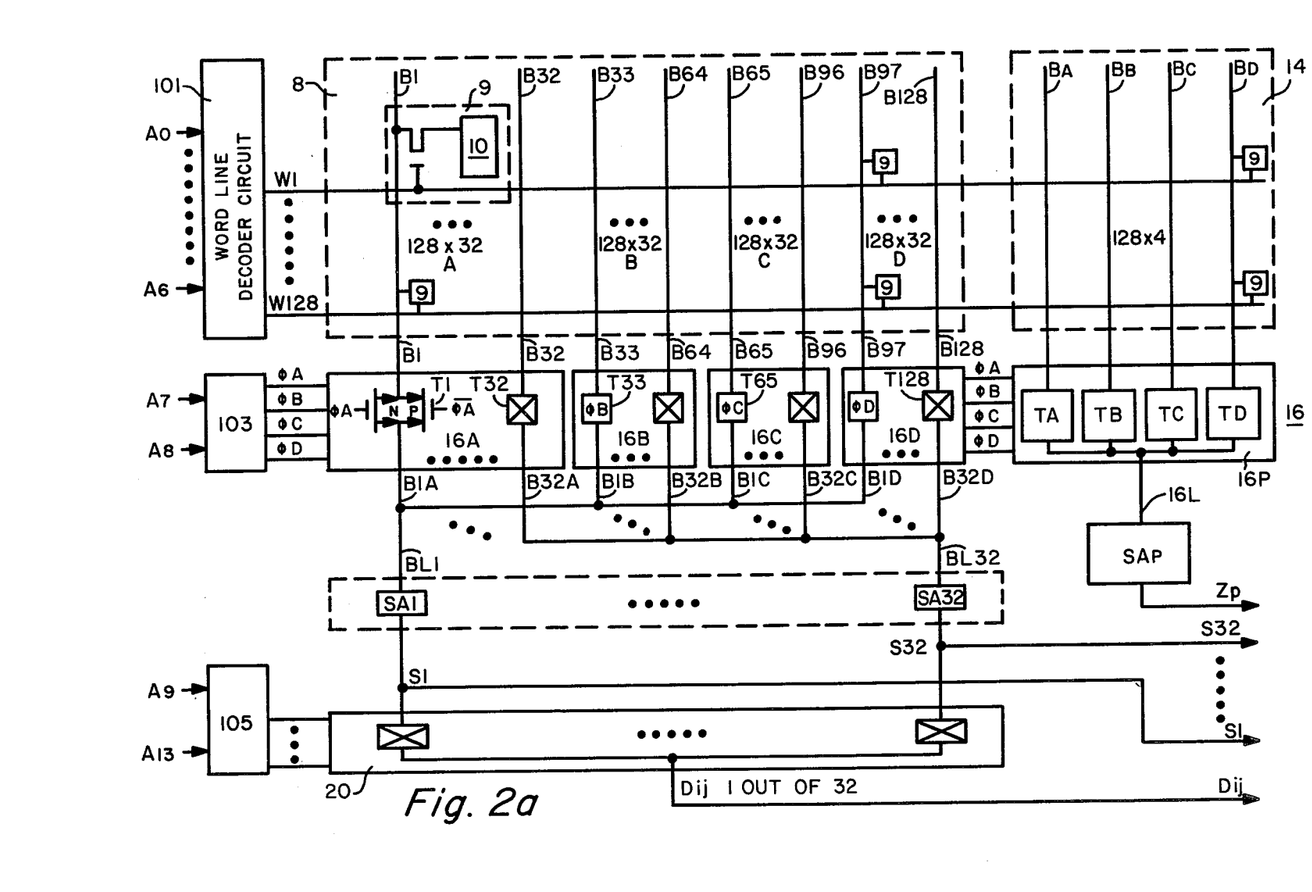
FIGS. 2A, 2B and 2C are diagrams of portions of a subsystem embodying the invention used to practice the invention.
Figure 2B:
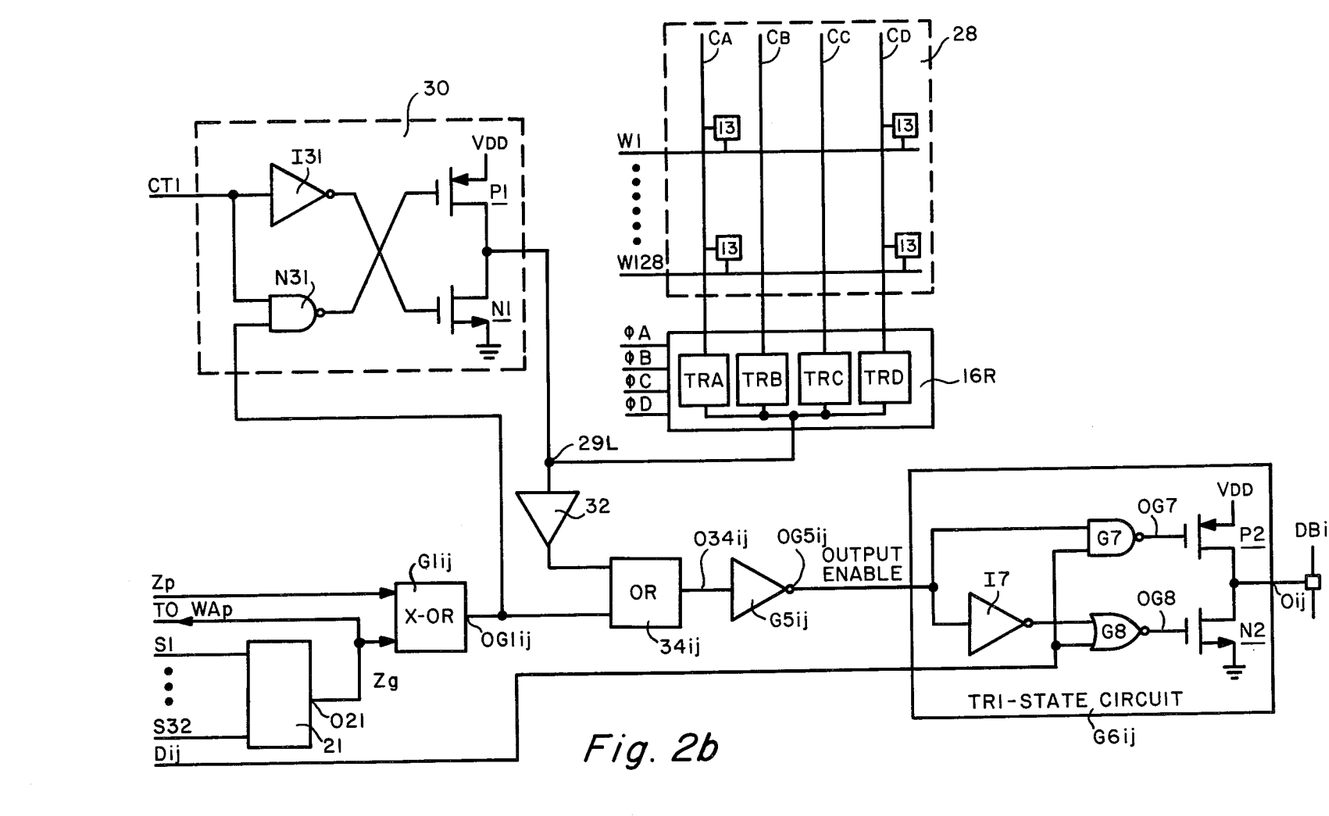
Figure 2C:
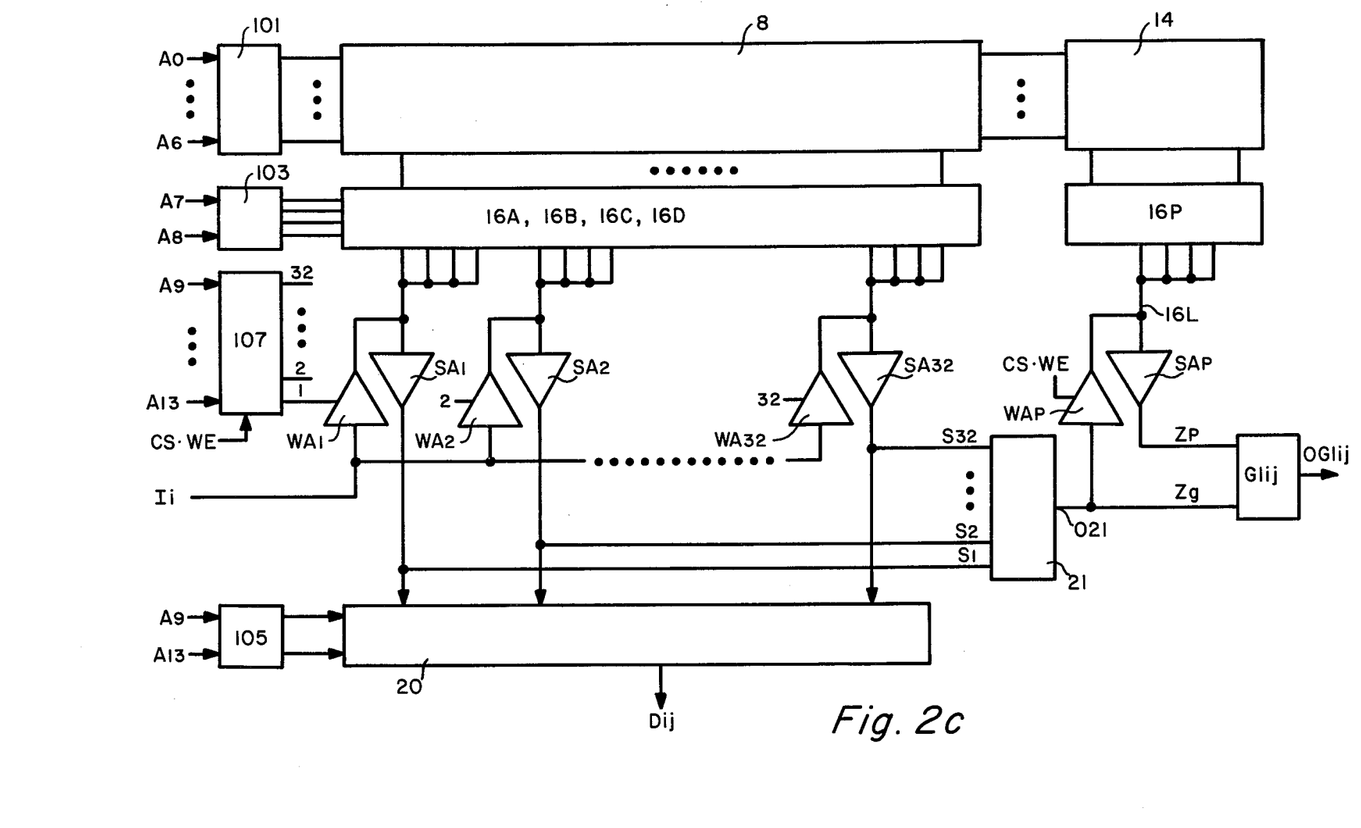

The detailed operation of the system of FIG. 1, as well as some significant features in the construction and partitioning of the chips is best understood by first examining FIGS. 2A, 2B, and 2C which detail part of the contents of each one of the Mij chips. As shown in FIGS. 2A, 2B and 2C each Mij module includes:

(1) A Random Access Memory (RAM) array 8 comprised of 16,384 memory cells 9 arranged in 128 rows (words) and 128 columns (bits). There is a word line (Wr) per row of cells and a bit conductor (Bj) per column of cells. Each row of array 8 is partitioned into 4 "internal" words or sections, respectively designated A, B, C, and D, of 32 bits (columns). So organized, array 8 is effectively partitioned into 512 (i.e. 128×4) "internal" words of 32 bits each. In array 8, each memory cell 9, as set forth in copending applications entitled MEMORY SYSTEM WITH ERROR DETECTION AND CORRECT bearing Ser. No. 362,463 and MEMORY SYSTEM WITH ERROR STORAGE bearing Ser. No. 362,464, may be a static cell, a dynamic cell, a read-only memory cell, a non-volatile cell, or any other suitable storage cell.

(2) A parity array 14 (as shown in FIG. 2A) having 512 bit locations at which are found memory or storage elements which may be of the same type as those in array 8 or which may be any other suitable data storage devices. Each bit location of array 14 stores a parity bit corresponding to an "internal" 32-bit word of array 8. Array 14 is arranged in 128 rows and 4 columns, the elements of each row of array 14 being connected to a row (word line) conductor connected to a corresponding word line conductor of array 8, and the elements of each column of elements being connected to a column (bit) conductor, $B_A$, $B_B$, $B_C$, and $B_D$. Each bit conductor of array 14 corresponds to a like lettered section in array 8.

(3) A latching array 28, as shown in FIG. 2B, which may be similar to a parity array 14 and like array 14 includes 512 bit locations, one location for each internal word of array 8. A storage or memory element 13 is located at each bit location of array 28. The elements 13 may be of the same type as those in array 8 and 14 and may be set to the "0" or "1" condition. In the discussion to follow it is arbitrarily assumed that an element 13 in a given location of array 28 set to "0" indicates no parity error in array 8 corresponsing to that bit location, whereas if the element is set to "1" it indicates a parity error in the corresponding internal word of array 8. Element 13, once written to the binary "1" state, permanently stores that condition until a system erase condition is established. The "permanent" storage can be achieved in any one of a number of ways as, for example, by the choice of cell used in array 28 or by the mode of writing information into the cells.

The elements of array 28 are arranged in 128 rows and 4 columns. The elements 13 of each row of array 28 are connected to a row (word line) conductor connected to a corresponding word line conductor of arrays 8 and 14 and the elements of each column are connected to a corresponding column (bit) conductor, $C_A$, $C_B$, $C_C$, and $C_D$. Each bit conductor of array 28 corresponds, to a like lettered section in arrays 8 and 14.

(4) A word line decoder 101 (as shown in FIG. 2A) to which 7 address bits ($A_0$ to $A_6$) are applied is coupled to the row conductors of arrays 8, 14 and 28. In response to address bits $A_0$ through $A_6$ decoder 101 enables one row, at a time, of the 128 rows of arrays 8, 14 and 28.

(5) An internal word and parity bit selector 16, comprised of sections 16A, 16B, 16C, 16D, 16P and 16R, is coupled to arrays 8, 14 and 28 for selecting a particular "internal" word and its corresponding parity bit. Selector 16 is controlled by an internal word predecoder 103 to which two (2) address bits ($A_7$ and $A_8$) are applied. The two address bits ($A_7$ and $A_8$) determine which one of the four sections (i.e. which group of 32 bits) or array 8 and which column conductor of arrays 14 and 28 is respectively coupled to the thirty-two bit lines (BLj), onto parity line 16L, and onto line 29L. Selector 16 includes one transmission gate per bit conductor in arrays 8, 14, and 28. Selector 16 is partitioned so that corresponding to each section (A, B, C, D) of array 8 there is a corresponding section (16A, 16B, 16C and 16D). Under the control of address bits $A_7$ and $A_8$ and decoder 103 only one of sections A, B, C, and D is turned-on at any one time, whereby only 32 (one section) of the 128 bit conductors of array 8 are coupled, at any one time, via transmission gates to the 32 bit lines (BL1 through BL32). Similarly, the 4 bit conductors of parity array 14 are multiplexed via corresponding transmission gates $T_A$, $T_B$, $T_C$ and $T_D$ in section 16P onto parity line 16L. Only one of $T_A$, $T_B$, $T_C$ and $T_D$ is turned-on at any one time, being turned-on only when its corresponding like lettered group 16A, 16B, 16C or 16D is turned-on. The signal on line 16L is applied via an amplifier $SA_P$ to one input of a two-input Exculsive-OR gate G1ij. Thus, when a 32 bit word is read-out of array 8 onto bit lines BL1 through BL32, a parity bit (Zp) stored in array 14 corresponding to that word is read-out onto line 16L and applied to G1ij.

Similarly, the 4 bit conductors of latch array 28 are multiplexed via corresponding transmission gates TRA, TRB, TRC and TRD in section 16R onto latch line 29L. Only one of TRA, TRB, TRC and TRD is turned-on at any one time, being turned-on only when its corresponding like lettered group 16A, 16B, 16C or 16D is turned-on. The signal on line 29L is applied via an amplifier 32 to one input of a two-input OR gate34ij. Thus, when a 32 bit word is read-out of array 8 onto bit lines BL1 through BL32, a signal stored in array 28 corresponding to that word is read-out onto line 29L and applied via an amplifier 32i to OR gate 34ij.

(6) 32 sense amplifiers and latches (SAj) coupled to the bit lines for amplifying the 32 bits of a selected "internal" 32 bit word. The signals on bit lines BLj are amplified by their corresponding sense amplifiers SAj to produce well defined binary levels at their Sj outputs. That is, either a "low" level is produces, where the low level is a voltage at or close to ground potential which is arbitrarily defined as logic "0" or "0"; or a "high" level is produced, where the high level is a voltage at or close to $V_{DD}$ volts which is arbitrarily defined as logic "1" or "1", and where $V_{DD}$ is assumed positive with respect to ground.

(7) A bit decoder 20 is coupled between the Sj outputs and a data bit output for selecting a single "raw" data bit out of a selected "internal" 32-bit word and producing the "raw" data bit output (Dij). Output Dij is denoted herein as "raw" because it is coupled to tri-state circuit G6ij before being applied to the chip output (Oij) from which it is coupled via its data bus (DBi) to a a microprocessor (not shown) or other data handling systems "external" to the memory chip.

(8) A bit predecoder 105 to which are applied 5 address bits ($A_9$ and $A_{13}$) is coupled to decoder 20 and controls bit decoder 20 to select a particular data bit Dij out of the 32 bit "internal" word.

(9) A section for parity checking and data output control is shown in FIG. 2B. Included is a parity generator 21 having 32 inputs to which are applied the 32 Sj signals. Therefore the 32 bits of a selected internal word are applied, after amplification, to generator 21 which has an output (O21) at which is produced a signal Zg which represents the parity of the 32 bit "internal" word. The output Zg of generator 21 and the corresponding parity bit Zp derived from the output of the internal word parity selector 16P are applied to the two inputs of gate G1ij. The parity generator 21 and X-OR gate G1ij together comprise a parity checker. The output (OG1ij) of G1ij (which when it is equal to a "1" indicates a parity error) is applied to the other input of OR gate 34ij.

The output O34ij gate 34ij is applied to the input of an inverter G5ij. The output OG5ij of G5ij and the "raw"-]Dij data output are applied to the two inputs of a tri-state circuit G6ij whose output (Oij) is applied to a corresponding data bus (DBi) line. As detailed below and in copending application MEMORY SYSTEM WITH ERROR STORAGE, referred to above, and whose teachings are incorporated herein by reference, the output O34ij will be "high" or "1" whenever there is a present or past parity error associated with the internal word being read and one of whose bits (Dij) is being read-out and O34ij will be "low" or "0" when there is no parity error associated with the internal word.

The output OG5ij of gate G5ij is applied to one input of a two-input NAND gate G7 and to the input of an inverter I7. The output of inverter I7 is applied to one input of two-input NOR gate G8. The other input to NAND gate G7 and to NOR gate G8 is the raw data (Dij). The output (OG7) of gate G7 is applied to the gate electrode of an insulated-gate field-effect transistor (IGFET) P2. The output OG8 of NOR gate G8 is applied to the gate electrode of an IGFET N2. The source drain path of P2 is connected between a source of operating potential $V_{DD}$ and the chip output Oij and the source drain path of transistor N2 is connected between Oij and ground potential. Transistors N2 and P2, when turned-on, are capable of clamping Oij and DBi to ground and $V_{DD}$, respectively, via their relatively low ON-impedance. When turned-off, N2 and P2 appear as high impedances and have little, if any, effect on the output Oij and DBi.

The operation of the tri-state circuit G6ij, detailed in TABLE A below, is such that whenever O34ij is "high"—indicating the presence of a parity error in the selected internal word containing the data bit Dij being read-out—P2 and N2 are turned-off and the output Oij floats. That is, Oij is coupled to $V_{DD}$ and ground via the high impedances of turned-off transistors N2 and P2. Whenever O34ij is "low"—indicating no error in the selected internal word containing the data bit (Dij) being read-out—Oij will be clamped to $V_{DD}$ or to ground via the low ON-impedance of P2 or N2 as dictated by the value of Dij.

TABLE A

| O34ij | OG5ij | Dij | OG7 | OG8 | P2 | N2 | Oij |
|---|---|---|---|---|---|---|---|
| (Error) Hi | Disable LO | HI | HI | LO | OFF | OFF | Floating |
| (Error) Hi | Disable LO | LO | HI | LO | OFF | OFF | Floating |
| (No Error) LO | Enable HI | HI | LO | LO | ON | OFF | HI |
| (No Error) LO | Enable LO | LO | HI | HI | OFF | ON | LO |

When O34ij is high, OG5ij low causes OG7 to be high and OG8 to be low. When OG7 is high P2 is turned-off and when OG8 is high N2 is turned-off. When P2 and N2 are turned-off Oij is left to float. When O34ij is low, OG5ij is high and the tri-state circuit is enabled. The output Oij is then driven to assume the same binary state as Dij. That is when Dij is high (logic "1") transistor P2 is turned-on clamping Oij to $V_{DD}$ via its relatively low-ON-impendance while N2 is turned-off. Where Dij is low (logic "0") transistor P2 is turned-off while N2 is turned-on clamping Oij to ground via its relatively low-ON-impedance.

Assume, for example, that OG11 of chip M11 is high indicative of the presence of a parity error in the internal word read in chip M11. O11 will then be floating in that N2 and P2 of G611 will be turned-off. Assume that OG12 of chip M12 is low indicating that the parity of its internal word is correct. O12 will then be driven to $V_{DD}$ or ground depending on the value of D12. Hence, correct data is applied to DB1 since any false or suspected data present in M11 is inhibited or prevented from being applied to DB1.

It has thus been shown that when there is a parity error associated with an internal word, any data bit in that word is suspect and none of the data bits in that word will be read-out to an external source or user. It is only when the parity of the internal word is correct that the bits of that internal word will be relied upon to apply an output signal to an external source or user.

The writing of information into the RAM array 8, the generation of a parity bits and their storage in parity array 14, the read-out of information and parity checking and storage will now be discussed in greater detail.

As mentioned, OG1ij indicates whether or not a parity error exists in an internal word. The information present at OG1ij is written into array 28 by means of a network 30 which includes an inverter I31, a two-input NAND gate N31 and two insulated-gate field-effect transistors (IGFETs) P1 and N1. OG1ij is applied to one input of gate N31 while a control signal (CT1) generated by a microprocessor or other source (not shown) is applied to the other input of N31 and to the input of inverter I31. The output O131 of I31 is applied to the gate electrode N1 and the output ON31 of N31 is applied to the gate electrode of P1. The source-drain path of P1 is connected between a source of $V_{DD}$ volts and line 29L and the source-drain path of N1 is connected between line 29L and ground. Transistors N1 and P1 are relatively large devices capable, when turned-on, of clamping line 29L to ground or $V_{DD}$, respectively, via a relatively low impedance.

Circuitry needed to write information into memory 8 and parity array 14 is shown separately in FIG. 2C to simplify the drawings.

Referring to FIG. 2C, when a new data bit Ii is to be written into the memory 8 a decoder 107 is first energized in response to a logical product signal CS•WE (where CS=chip select and WE=write enable) from a microprocessor or other source (not shown). Decoder 107 has 5 address inputs (A9 through A13) and 32 outputs. Each one of the 32 outputs is connected to a different write amplifier (WAj). The write amplifiers are connected at their inputs to an input signal line and at their outputs to a bit line BLj. They are, preferably, low output impedance tri-state devices capable of overriding and overwriting the information on their associated bit lines. In response to any selected 5 bit address (A9 through A13) applied to its inputs, decoder 107 enables one of the write amplifiers called for by that address.

It should be noted that during a write cycle (in fact, just before a new bit is actually written into a memory location) a read is performed. That is, an internal word called for by addresses A0–A6 and A7–A8 is read-out onto the bit lines (BLj). The selected write amplifier in response to Ii writes over the information read-out on its associated bit line. The information on the 32 bit lines thus includes 31 old bits of information and one new bit of information.

Consequently, when a new data bit is being written into a chip, the data bit being written becomes part of an "internal" word. The "new" internal word is coupled via the SAj amplifiers to parity generator 21. A new parity bit corresponding to the parity of the "new" internal word is generated at the output O21 of parity generator 21 which is the same parity generator 21, used during the read cycle. The "new" parity bit Zg at the output of generator 21 is applied via a write amplifier WAp onto line 16L and is then written and stored in a given location of parity array 14 corresponding to the location of the selected internal word. Note that WAp is controlled by the CS•WE signal, whereby WAp is on regardless of which WAj amplifier is selected by decoder 107.

It is asumed that the RAM array 8 is organized into internal words, each having a length of 32 bits and that corresponding to each internal word there is a parity bit stored in array 14. Whenever a particular data bit location is addressed and its bit is to be read out, the 32 bit internal word in which the particular data bit is contained is read-out and is applied to the inputs of a parity generator 21. The output Zg of the parity generator 21, indicative of the parity of the internal word, is applied to X-OR gate G1ij. The parity bit Zp stored in array 14 corresponding to the 32 bit internal word is also read-out and is applied to the other input of gale G1ij.

Concurrently, the 32-bit internal word is further decoded in decoder 20 to produce at the output of 20 the particular "raw" data bit (Dij) corresponding to the 14 address bits applied to the system. The output, OG1ij, of G1ij indicates whether parity is correct. As shown in table 1 below, if OG1ij is a logic "zero", there is no parity error in the "internal" 32-bit word read-out of the memory. If OG1ij is a "1", there is a parity error in the "internal" word read-out of the memory. OG1ij indicates the status of the parity of the "internal" word at the chip or subsystem level. Therefore OG1ij functions as an error flag indicating whether an error exists in one of 33 bits, where the 33 bits include the 32 bits of the "internal" word read-out and its corresponding parity bit.

TABLE 1

| $Z_g$ | $Z_p$ | OG1ij | |
|---|---|---|---|
| 0 | 0 | 0 | Match - No Error |
| 1 | 0 | 1 | Error |
| 0 | 1 | 1 | Error |
| 1 | 1 | 0 | Match - No Error |

OG1i is applied to one input of OR gate 34 and to one input of NAND gate N31.

As noted above, if OG1ij indicates the presence of an error, there is no mechanism for (immediately) correcting the faulty bit in the internal word. If subsequently a "new" data bit is written into the faulty internal word, a new parity bit will be generated and stored in parity array 14. When the "new" data bit is then read-out the error flag OG1ij will indicate no error when in fact the error may still be present in the internal word. In the present system such an error continues to be indicated. It is stored in array 28 and its operation and the operation of the associated write and read networks are now detailed.

The type of information written into array 28 is determined by control signal CT1 and the output OG1ij. When CT1 is low, OI31 is high and N1 is turned-on clamping line 29L to ground. Concurrently, when CT1 is low, (regardless of whether OG1ij is high or low) ON31 is high maintaining P1 turned-off.

When CT1 is low, the signal O29 on line 29L is low; every bit location in memory array 28 can be addressed, via word lines W1 through W128 and column conductors $C_A$, $C_B$, $C_C$ and $C_D$, and a "0" written into each bit location. The all "0" condition of array 28 corresponds to the initial condition to which array 28 is set and also indicates the absence of any error in array 8. Following the initializing of latch array 28, CT1 is driven high. The output of I31 then goes low maintaining N1 turned-off. Since N1 is turned-off, line 29L cannot be driven to the zero volt of "0" condition and "0's" can no longer be written into array 28; (i.e. only "1'S" can be written into memory 28).

CT1-high applied to one input of gate N31 causes the latter to function as an inverter with respect to the OG1i signal. When OG1i is low—indicating that there is no parity error in the internal word addressed by the memory system (i.e. a match exists between Zp and Zg)—ON31 is high and P1 remains turned-off. Concurrently, OI31 is also low and N1 is also turned-off. Hence, P1 and N1 are turned-off and appear as very high impedances connected between line 29L and their respective power lines. Due to the high impedances of P1 and N1, the voltage on line 29L is determined by the condition of the addressed memory cell of array 28. Any addressed storage element in array 28 will then remain in the previously written "0" (or "1") condition.

When OG1ij goes high—indicative of a parity error—ON31 is driven low and P1 is turned-on clamping line 29L to $V_{DD}$ volts or "high". The bit location in array 28 corresponding to the selected "internal" word in array 8 will then be written to the high or "1" state. Once written to the "1" state, the storage element remains high until CT1 is again driven low. Barring the generation of a CT1-low signal, a bit location in array 28 once written high remains high. The condition of line 29L for the different possible values of CT1 and OG1ij is summarized in Table 2 below.

TABLE 2

| CT1 | OG1i | P1 | N1 | 029 |
|---|---|---|---|---|
| LO | HI | OFF | ON | Active LO |
| LO | LO | OFF | ON | Active LO |
| HI | LO | OFF | OFF | Floating |
| HI | HI | ON | OFF | Active HI |

The role of array 28, during a read cycle, after a "1" has been written in a bit location of array 28 is now examined.

On a subsequent read cycle, if a once faulty internal word of array 8 is again addressed, the "1" stored in a corresponding bit location in array 28 is addressed and produced on line 29L. It is then sensed via amplifier 32 and applied to one input of OR gate 34ij. The output of gate 34ij thus indicates the existence of a present or past error whenever a faulty or once faulty internal word is selected.

Thus, once an error has been detected in an internal word, there is an error flag stored in array 28 which will be produced whenever that internal word location is addressed. The error indication will persist until the system is cleared by driving CT1 low and cycling through the addresses of array 28. After an error in an internal word is detected and stored on array 28 a new data bit may be written into the previously faulty internal word, and a new parity bit corresponding to the "new" internal word is generated and stored in parity section 14. Assuming that no error creeps into the new internal word and/or the associated parity bit, the parity for the new word will be correct (OG1i=0). But, assumming the error previously detected in this word has not been corrected, there is still an error in the word even though the parity checker 21, G1ij says that parity is correct. This error is indicated in the present system by the output (O34ij) of OR gate 34 which is high.

As discussed earlier the output of OR gate 34ij is then used to disable or enable the tri-state gate G6ij.

For ease of illustration the tri-state circuit G6ij has been shown with two input signals, OG5i, and Dij.

OG5ij functions as an enable/disable control signal, and Dij is the data input. It should be appreciated that, in practice, other signals (not shown) are applied to the tri-state circuit, directly or indirectly, to selectively disable it as, for example, during write and when the chip is not selected. Also, in practice, the OG5ij output could be brought out to a separate pin on the chip from which it could be selectively coupled to generate a chip select or deselect signal fed back to control chip functions.

Unlike Hamming code correction, two level parity code correction, or other known techniques, the present error avoidance technique can be extended to detect and correct two or more errors. To protect against two errors on two different chips three chips would be used with their I/O terminals being connected to the same data line. Correction to protect against two errors within the same internal word on the same chip, an internal two level parity check could be used or any other suitable error detection scheme. A singular advantage of circuits and systems embodying the invention is that the error bit does not have to be located. It is sufficient to detect an error in a group of data bits. There is no need to identify which bit is faulty. This enables a single and fast system to be built. The error avoidance system is also readily adaptable for use with memory chips whose output are "byte" wide (each byte having 4 or 8 bits wide in comparison to the chips shown in FIGS. 1 and 2 having a single output) where conventional Hamming code correction systems are defeated by multiple bit failures on a single chip.

What is claimed is:

1. A memory system comprising:
   a common bus adapted to receive data signals;
   N memory modules, where N is an integer greater than one, each one of said N memory modules being operated in parallel with the same information being written in their corresponding bit locations, each one of said N modules including;
   (a) a random access memory (RAM) array and organized into W internal words, each word having L bits;
   (b) a parity array for storing a parity bit for each internal word;
   (c) means coupled to said RAM array for selectively reading a selected internal word and for concurrently reading-out onto a data output line a selected bit contained within said selected internal word;
   (d) means receptive of a selected internal word and its corresponding parity bit for ascertaining whether its parity is correct and for producing a first output signal indicative thereof;
   (e) selectively enabled means within each module for coupling its data output line to said common bus; and
   (f) control means within each module, coupled to said selectively enabled means, responsive to said first output signal for disabling said selectively enabled means and preventing the application of said selected bit to said common bus when said first output signal has a value indicative of a parity error.

2. The memory system as claimed in claim 1 wherein said selectively enabled means includes a tri-state circuit receptive of said first output signal and said selected bit and having an output coupled to said common bus, said tri-state being set to a high output impedance condition when said first output signal is indicative of a parity error and said tri-state output being driven to a binary condition responsive to the value of said selected bit when said first output signal is indicative that the parity is correct.

3. A memory system comprising:
   a common bus structure;
   N memory modules, where N is an integer greater than 1, and where the same information is written into each one of said N modules,
   and where the N modules are read-out in parallel, each one of said N modules including:
   (a) a random access memory (RAM) array organized into W internal words, each word having L bits;
   (b) means for generating a parity bit for each interval word and a parity array for storing each one of said parity bits;
   (c) means coupled to said RAM for reading-out a selected internal word and for concurrently reading-out a particular subset of the L bits in said internal word; and
   (d) means receptive of a selected internal word and its corresponding parity bit for ascertaining whether its parity is correct and for producing a first output signal indicative thereof;
   (e) selectively enabled means within each module for coupling said particular subset of the L bits to said common bus structure; and
   (f) means within each module responsive to said first output signal when it is indicative of a parity error in the selected internal word for disabling said selectively enabled means and preventing the application of said particular subset of the L bits to said common bus structure, and responsive to said first output signal when it is indicative of no parity error for enabling said selectively enabled means.

4. A memory system comprising:
   a common line;
   "N" similar memory modules having means for storing data bits and each module having a data output connected to said common line; where N is an integer greater than 1;
   means for writing the same information into said N memory modules; and
   reading means for subsequently reading, in parallel, supposedly identical information stored in said N modules; said reading means including means located in each module for checking the parity of the information being read-out of each module and also including means for coupling the information from said module to said common line if the parity check indicates it to be correct and for inhibiting the passage of information to said common line if the parity check indicates the presence of an error, whereby only data bits whose corresponding parity indicates them to be correct are coupled from said N modules to said common line.

* * * * *

UNITED STATES PATENT AND TRADEMARK OFFICE
CERTIFICATE OF CORRECTION

PATENT NO. : 4,464,754
DATED : August 7, 1984
INVENTOR(S) : Roger Green Stewart et al.

It is certified that error appears in the above-identified patent and that said Letters Patent is hereby corrected as shown below:

Col. 2, line 32, change "of" to - - - on - - -.

Col. 3, line 49, change "or" to - - - of - - -.
Col. 4, line 23, change "produces" to - - - produced - - -.
Col. 4, line 40, change "and" to - - - to - - -.
Col. 4, line 58, after "034ij" insert - - - of - - -.
Col. 4, line 60, remove "]".
Col. 5, line 44, after "high," insert - - - OG5ij is low, and the tri state circuit is disabled. That is - - -.
Col. 5, line 52, change "impendance" to - - - impedance - - -.
Col. 7, line 14, change "gale" to - - - gate - - -.

Signed and Sealed this

Second Day of April 1985

[SEAL]

Attest:

DONALD J. QUIGG

Attesting Officer

Acting Commissioner of Patents and Trademarks